United States Patent
Sekiguchi

(10) Patent No.: US 10,277,167 B2
(45) Date of Patent: Apr. 30, 2019

(54) OSCILLATION ELEMENT AND OSCILLATOR USING THE SAME

(71) Applicant: CANON KABUSHIKI KAISHA, Tokyo (JP)

(72) Inventor: Ryota Sekiguchi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/120,889

(22) PCT Filed: Feb. 24, 2015

(86) PCT No.: PCT/JP2015/056025
§ 371 (c)(1),
(2) Date: Aug. 23, 2016

(87) PCT Pub. No.: WO2015/129910
PCT Pub. Date: Sep. 3, 2015

(65) Prior Publication Data
US 2016/0373061 A1   Dec. 22, 2016

(30) Foreign Application Priority Data

Feb. 28, 2014 (JP) ................................. 2014-039032
Feb. 9, 2015 (JP) ................................. 2015-023663

(51) Int. Cl.
*H03K 3/315* (2006.01)
*H03B 7/12* (2006.01)
(Continued)

(52) U.S. Cl.
CPC ................. *H03B 7/12* (2013.01); *H03B 7/08* (2013.01); *H03B 9/12* (2013.01); *H03H 7/0123* (2013.01);
(Continued)

(58) Field of Classification Search
CPC ... H03B 7/14; H03B 7/00; H03B 7/08; H01Q 1/38; H03H 11/52; H03H 7/08; H03H 7/383
(Continued)

(56) References Cited

U.S. PATENT DOCUMENTS

2007/0279143 A1   12/2007  Itsuji
2012/0001698 A1*  1/2012  Koyama ................. H03B 7/14
                                                   331/107 T
(Continued)

OTHER PUBLICATIONS

M. Reddy et al; "Monolithic Schottky-Collector Resonant Tunnel Diode Oscillator Arrays to 650 GHz;" IEEE Electron Device Letters; vol. 18, No. 5, May 1997; pp. 218-221.

*Primary Examiner* — Arnold M Kinkead
(74) *Attorney, Agent, or Firm* — Canon U.S.A., Inc. IP Division

(57) ABSTRACT

An oscillation element that oscillates an electromagnetic wave includes a negative resistance element and a resonator including a first conductor and a second conductor, in which the negative resistance element and the resonator are arranged on a substrate, the negative resistance element is electrically connected to the first conductor and the second conductor, the first conductor and the second conductor are capacitively coupled to each other, and when a capacitance between the first conductor and the second conductor is set as C, an inductance of the first conductor and the second conductor is set as $L_1$, a speed of the oscillated electromagnetic wave in vacuum is set as $C_0$, a relative dielectric constant of the substrate is set as $\varepsilon_r$, and a diagonal line length of the substrate is set as d, a series resonant frequency $f_1$ of the resonator satisfies $f_1 = 1/\{2\pi\sqrt{(L_1 C)}\}$, and $f_1 < C_0/[d\sqrt{\{(1+\varepsilon_r)/2\}}]$.

21 Claims, 8 Drawing Sheets

(51) Int. Cl.
*H03H 7/01* (2006.01)
*H03B 9/12* (2006.01)
*H03H 7/38* (2006.01)
*H03H 11/52* (2006.01)
*H03B 7/08* (2006.01)

(52) U.S. Cl.
CPC .......... *H03H 7/1741* (2013.01); *H03H 7/383* (2013.01); *H03H 11/52* (2013.01)

(58) Field of Classification Search
USPC ............. 331/107 T, 108 C, 107 R, 115, 132; 343/700 MS
See application file for complete search history.

(56) References Cited

U.S. PATENT DOCUMENTS

| | | | |
|---|---|---|---|
| 2012/0105161 A1* | 5/2012 | Ouchi | H03B 9/12 331/107 T |
| 2012/0119838 A1 | 5/2012 | Koyama | |
| 2013/0328635 A1 | 12/2013 | Sekiguchi | |

\* cited by examiner

OSCILLATION ELEMENT AND OSCILLATOR USING THE SAME

TECHNICAL FIELD

The present invention relates to an oscillation element including a negative resistance element and an oscillator using this oscillation element.

BACKGROUND ART

A negative resistance element involves a resonator and is useful in an application field of an electromagnetic wave oscillation element. Up to now, it has been proposed that an electromagnetic wave including at least a part of a frequency band from a millimeter waveband to a terahertz band (which is higher than or equal to 30 GHz and lower than or equal to 30 THz) (hereinafter, will be simply referred to as "terahertz wave") can be generated by using the negative resistance element. As one of the configurations, NPL 1 discloses a monolithic oscillator obtained by integrating the negative resistance element and the resonator to each other on a substrate. Slot antennas are integrated to each other on a semiconductor substrate including the negative resistance element, and a resonator structure and a gain medium are constituted in a monolithic manner.

FIG. 9 illustrates the oscillator according to NPL 1. In this oscillator, the negative resistance element uses a resonant tunneling diode S-RTD 91 provided with a Schottky barrier on a collector side. The resonator is a slot antenna. The slot antenna is constituted by a metallic pattern 92 on the semiconductor substrate and provided with capacitances 93 and 94 in end parts. The oscillator according to NPL 1 is further provided with a rectifier diode 95.

Here, the rectifier diode 95 functions as a stabilization circuit configured to suppress a parasitic oscillation which becomes a problem in the oscillator using the negative resistance element. The parasitic oscillation refers to a parasitic oscillation in a frequency region on a lower frequency side than a desired oscillation frequency $f_{osc}$. Since the above-described parasitic oscillation decreases an oscillation output in the oscillation frequency $f_{osc}$, the presence of the stabilization circuit may be considered to be important for the oscillator using the negative resistance element.

In view of the above, according to NPL 1, to reduce the parasitic oscillation, the stabilization circuit having a low impedance from the viewpoint of the negative resistance element is arranged in a location within ¼ of a wavelength $\lambda_{osc}$ corresponding to the oscillation frequency $f_{osc}$ towards a power supply side as viewed from the S-RTD 91. Specifically, the shunt rectifier diodes 95 are integrated as the stabilization circuit in a location within $\lambda_{osc}/4$ towards a power supply 96 side as viewed from the S-RTD 91. A resistance 97 corresponds to a total of an internal resistance of the power supply 96 and a resistance of an electric wire. In this manner, by decreasing an impedance on a side of the power supply that supplies a bias voltage in a frequency region that is higher than or equal to DC and lower than $f_{osc}$, it is possible to reduce the parasitic oscillation.

The above-described stabilization circuit in the related art for the suppression of the parasitic oscillation is a circuit configured to attenuate an amplitude of the parasitic oscillation in the low-frequency region where the oscillation is not desired by using a diode or a resistor. In the oscillation element or the oscillator that oscillates the electromagnetic wave in the millimeter waveband or the terahertz band, since the frequency range of the above-described low-frequency region is relatively widened, the amplitude of the parasitic oscillation is to be attenuated across the extremely wide band. For that reason, the design may be complicated, or the oscillation at the desired frequency may also be attenuated.

CITATION LIST

Non Patent Literature

NPL 1 Ruddy, IEEE Electron Device Letters, Vol 18, 218 (1997)

SUMMARY OF INVENTION

According to an aspect of the present invention, there is provided an oscillation element that oscillates an electromagnetic wave, the oscillation element including: a negative resistance element; and a resonator including a first conductor and a second conductor, in which the negative resistance element and the resonator are arranged on a substrate, the negative resistance element is electrically connected to the first conductor and the second conductor, the first conductor and the second conductor are capacitively coupled to each other, and when a capacitance between the first conductor and the second conductor is set as C, an inductance of the first conductor and the second conductor is set as $L_1$, a speed of the oscillated electromagnetic wave in vacuum is set as $C_0$, a relative dielectric constant of the substrate is set as $\epsilon_r$, and a length of a diagonal line of the substrate is set as d, a series resonant frequency $f_1$ of the resonator satisfies $f_1=1/\{2\pi\sqrt{(L_1C)}\}$, and

[Math. 2]

$$f_1 < C_0 \bigg/ \left( d \times \sqrt{\frac{1+\epsilon_r}{2}} \right). \tag{3}$$

Further aspects of the present invention will become apparent from the following description of exemplary embodiments with reference to the attached drawings.

DESCRIPTION OF EMBODIMENTS

First Exemplary Embodiment

An oscillator that oscillates a terahertz wave includes an oscillation element provided with a negative resistance element and a resonator of a distributed constant type, and a power supply that supplies a bias voltage to the negative resistance element. The bias voltage from the power supply is supplied to the negative resistance element via a bias supply unit including an electric wire and a conductor. A parasitic low-frequency oscillation (parasitic oscillation) in the terahertz wave oscillator is generated in many cases because of a structure accompanied by this bias supply unit. Therefore, the bias supply unit is caused to have a characteristic in an oscillation element 100 according to the present exemplary embodiment. That is, a structure is adopted where a part of the bias supply unit is included in a part of a resonator 110 of a distributed constant type and is also capacitively coupled thereto.

Therefore, the bias supply unit is caused to have a characteristic in the oscillation element 100 according to the present exemplary embodiment. That is, the structure is adopted where the part of the bias supply unit is included in the part of the resonator 110 of the distributed constant type and also is capacitively coupled thereto. Specifically, the resonator 110 is a resonator of a two-conductor type in which two conductors 104 and 106 are capacitively coupled to each other. These conductors constitute an integrated resonator from the viewpoint of the terahertz wave that resonates the resonator 110. The above-described structure is created as a result of keen researches conducted by the inventor of the present invention et. al., and a process to reach the configuration according to the present exemplary embodiment will be described.

Figure 2A:
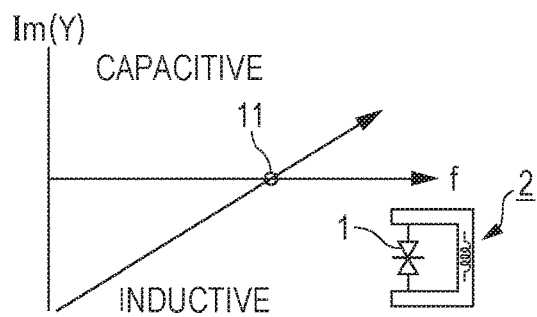
FIG. 2A is a schematic diagram of a configuration of a one-conductor resonator in a related art and an impedance plot thereof.
Figure 2D:
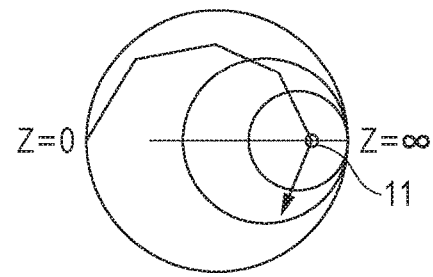
FIG. 2D is a Smith chart of the one-conductor resonator in the related art.

FIG. 2A is a schematic diagram illustrating a configuration of a resonator 2 constituted by a single conductor and an impedance plot of the resonator 2, and FIG. 2D is a Smith chart of the resonator 2. The impedance of the resonator 2 of the distributed constant type which is constituted by the single conductor becomes zero in a DC limit as illustrated in FIG. 2A. In the Smith chart of FIG. 2D, since the impedance of the resonator 2 turns to be clockwise as the frequency is increased, the next resonance point is a lowest order parallel resonance point 11 of the resonator 2.

The parallel resonance point 11 of the resonator 2 is the oscillation frequency $f_{osc}$ itself of the electromagnetic wave oscillated by the oscillation element or the oscillator. Because of this, the phase matching does not occur in the wide band that is higher than or equal to DC and lower than $f_{osc}$, and the oscillation is not performed in this frequency region. Therefore, it is conceivable that the parasitic low-frequency oscillation does not exist. It is however noted that the bias voltage is not applied at both end parts of a negative resistance element 1 since this is the continuous conductor having the common potential.

Figure 2B:
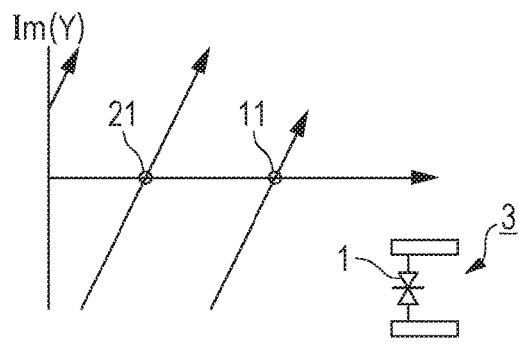
FIG. 2B is a schematic diagram of a configuration of a two-conductor resonator in the related art and an impedance plot thereof.
Figure 2E:
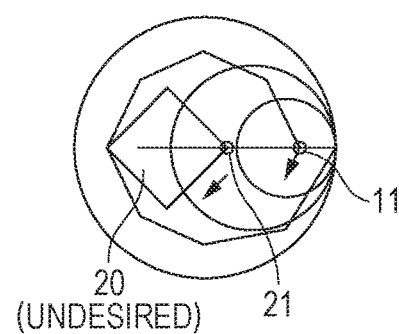
FIG. 2E is a Smith chart of the two-conductor resonator in the related art.

FIG. 2B is a schematic diagram illustrating a resonator 3 of the distributed constant type which includes two conductors and an impedance plot of the resonator 3, and FIG. 2E is a Smith chart of the resonator 3. As may be understood from the impedance plot of the resonator 3 illustrated in FIG. 2E, the impedance of the resonator 3 becomes ∞ in the DC limit. Therefore, an undesired loop 20 of a resonance circuit is generated in the wide band that is higher than or equal to DC and lower than $f_{osc}$ as illustrated in the Smith chart of FIG. 2E. This undesired loop is typically generated by a parasitic capacitance between the two conductors, a junction capacitance specific to the negative resistance element 1, an inductance of a wiring or an electric wire of the bias supply unit which is not illustrated in the drawing, or the like. Since the loop 20 generally contains a parallel resonance point 21, a parasitic low-frequency oscillation is induced. It is however noted that the bias voltage can be applied at both the end parts of the negative resistance element 1 because of the two conductors having different potentials.

Figure 2C:
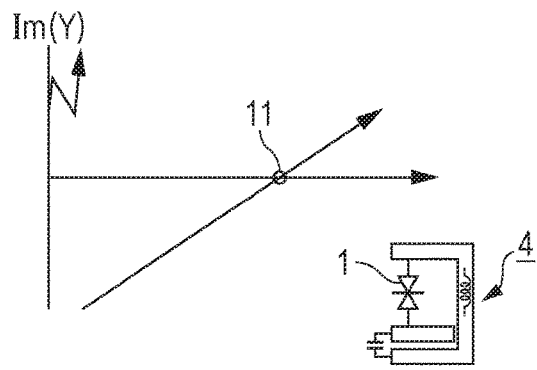
FIG. 2C is a schematic diagram of a configuration of a resonator according to the first exemplary embodiment and an impedance plot thereof.
Figure 2F:
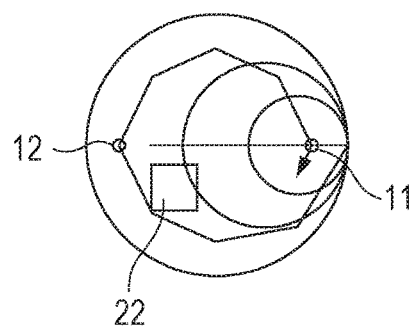
FIG. 2F is a Smith chart of the resonator according to the first exemplary embodiment.

FIG. 2C illustrates a resonator 4 of the distributed constant type which includes two capacitively-coupled conductors, and this is a structure for forming a base of the configuration according to the present exemplary embodiment. FIG. 2C is a schematic diagram illustrating the resonator 4 according to the present exemplary embodiment and an impedance plot of the resonator 4, and FIG. 2F is a Smith chart of the resonator. As illustrated in FIG. 2F, the impedance of the resonator 4 becomes ∞ in the DC limit but is put into a situation close to the resonator 2 by setting the capacitance C between the two capacitively-coupled conductors→∞. To be precise, the situation close to the resonator 2 is established by setting a series resonant frequency $f_1$ (hereinafter, will be referred to as "frequency $f_1$") formed by the inductance $L_1$ of the two conductors and the capacitance C to be sufficiently low. The frequency $f_1$ is represented by Expression (1).

$$f_1 = 1/\{2\pi\sqrt{(L_1 C)}\} \quad (1)$$

In actuality, the capacitance C→∞ is difficult to establish, but it is possible to further restrict the frequency region where the problematic parasitic oscillation is to be suppressed than the band that is higher than or equal to DC and lower than $f_{osc}$. That is, since the phase matching does not occur in the band that is higher than or equal to $f_1$ and lower than $f_{osc}$, it is possible to narrow the frequency region where the parasitic oscillation is to be suppressed down to the band that is higher than or equal to DC and lower than $f_1$. In the case of the narrow frequency region, it is facilitated to control a loop 22 on the Smith chart of FIG. 2F and it is simple to delete the resonance point in the band that is higher than or equal to DC and lower than $f_1$. Of course, it is possible to apply the bias voltage at both the end parts of the negative resistance element 1 since the two conductors having the different potentials are arranged.

In view of the above, in the resonator 4 as illustrated in FIG. 2C, the frequency $f_1$ is set to be lower than a predetermined frequency that has been set in advance. This can be achieved by adjusting the size of the capacitance coupling. Hereinafter, the configuration of the resonator 4 and the method for setting the frequency $f_1$ to be lower than the predetermined frequency will be described.

Figure 1:
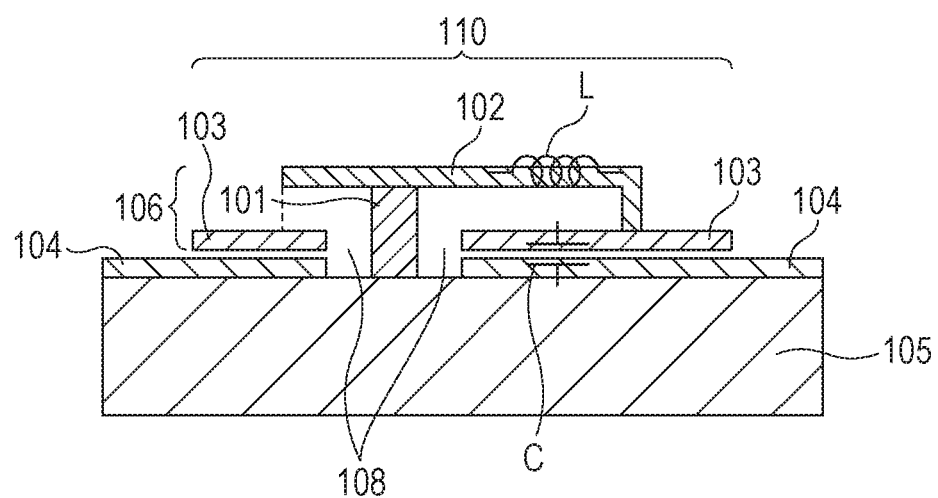
FIG. 1 is a cross sectional view of an oscillation element according to a first exemplary embodiment.

FIG. 1 is a cross sectional view of the oscillation element (semiconductor die) 100.

The oscillation element 100 includes a negative resistance element 101 (hereinafter, will be referred to as "element 101") and the resonator 110. The element 101 and the resonator 110 are arranged on a substrate 105. The resonator 110 includes a first conductor 106 (hereinafter, will be referred to as "conductor 106") including a first conductive layer 102 (hereinafter, will be referred to as "conductive layer 102") and a second conductive layer 103 (hereinafter, will be referred to as "conductive layer 103"), and also a second conductor 104 (hereinafter, will be referred to as "conductor 104") provided with a third conductive layer. The element 101 are electrically connected to each of the conductor 106 and the conductor 104. The conductors 104 and 106 may include a plurality of conductive layers or may be formed of a single conductor each. The conductor 104 and the substrate 105 may be integrated to each other. It is noted that, since the conductor 104 according to the present exemplary embodiment is constituted by the third conductive layer alone, the conductor 104 may be referred to as the conductive layer 104 in some cases in the following explanation.

With regard to the "oscillator" mentioned in the present specification, the resonator 110 corresponds to a part where a resonance region is formed by the conductor 104 and the conductor 106 and a part where the conductor 104 and the conductor 106 are arranged opposite each other to be capacitively coupled to each other among the conductor 104 and the conductor 106 arranged on the substrate 105. According to the present exemplary embodiment, the resonator 110 includes a part where a resonance region 108 in which the electromagnetic wave is resonated is formed and a part where the conductive layer 103 and the conductive layer 104 are arranged opposite each other. For that reason, the conductor 104 also exists on an outer side with respect to the resonator 110. It is noted that a part between the conductor 106 and the substrate 105 and a part between the conductor 104 and the substrate 105 may be hollow or may include a dielectric.

The substrate 105 is a conductive substrate and is a semiconductor die cut into a necessary and sufficient size for creating the oscillation element 100. The substrate 105 is in contact with the conductive layer 104 on the substrate 105 and can apply the bias voltage to the element 101. The conductive layer 102 and the conductive layer 103 are electrically short-circuited and connected to each other, and the bias voltage is applied to the other pole of the element 101. The conductive layer 102 and the conductive layer 103 can be treated as a continuous conductor having a common potential, and the bias voltage can be supplied to the other pole of the element 101.

The resonance region 108 surrounded by the conductor 106 and the conductor 104 is formed in the resonator 110. The resonance region 108 is hollow, and the terahertz wave oscillated from the element 101 is resonated. The configuration of the resonance region 108 is not limited to the hollow structure, and the oscillator of the distributed constant type where the dielectric is filled may be used, for example. The resonator 110 has the inductance $L_1$ between the conductor 106 and the conductor 104. The inductance $L_1$ is mainly an inductance derived from a relatively elongated part among the conductive layer 102 that forms a side face of the resonance region 108.

According to the present exemplary embodiment, although the main inductance is generated on the conductive layer 102, the inductance is derived from a shape of the elongated conductor, and when the conductive layers 103 and 104 have an elongated part, the inductance corresponds to a sum of the series. Therefore, hereinafter, the inductance $L_1$ may be collectively referred to as "inductance of the oscillator" in some cases.

The conductor 106 and the conductor 104 are capacitively coupled to each other. Specifically, the conductive layer 103 and the conductive layer 104 are arranged opposite each other at an interval that is lower than or equal to 1 μm are capacitively coupled to each other. The resonator 110 according to the present exemplary embodiment includes a relatively large capacitance C between the conductor 106 and the conductor 104. Therefore, the inductance $L_1$ and the capacitance C are provided in series between poles of the element 101.

The typical element 101 oscillates at a parallel resonant frequency (oscillation frequency) $f_{osc}$ (hereinafter, will be referred to as "frequency $f_{osc}$"). The structure that realizes this parallel resonance corresponds to the resonator 110 of the distributed constant type. The element 101 does not oscillate at the frequency $f_1$ defined by the inductance $L_1$ of the resonator 110 which is derived from the conductive layer 102 and the capacitance C between the conductive layer 103 and the conductive layer 104.

Since the impedance of the structure of the resonator 110 alternately repeats the series resonance and the parallel resonance on the frequency axis, the phase matching does not occur in principle in the band that is higher than or equal to the frequency $f_1$ of the same structure and lower than the frequency $f_{osc}$. That is, the oscillation element 100 according to the present exemplary embodiment does not attenuate the oscillation at the desired frequency $f_{osc}$ and can suppress the parasitic oscillation in the frequency region that is higher than or equal to $f_1$ and lower than $f_{osc}$. This is the same as above in the above-described explanation.

The frequency $f_1$ is set to be lower than the frequency of the parasitic oscillation derived from the wiring. This is because the structure accompanied by the bias supply unit corresponding to the cause of the parasitic low-frequency oscillation is roughly divided into two components including an electric wire 132 from a power supply 131 to the oscillation element 100 and a wiring of the oscillation element 100. It is noted that the "wiring" mentioned in the present specification is a conductor passing through a part from the supply of the bias voltage from the power supply 131 via the electric wire 132 to the oscillation element 100 up to the supply to the element 101. According to the present exemplary embodiment, the wiring refers to the conductors 104 and 106. The bias voltage from the power supply 131 is electrically connected to the oscillation element 100 via the electric wire 132 according to the present exemplary embodiment, but the configuration is not limited to this. A conductor that electrically connects the power supply 131 to the oscillation element 100 may be provided. That is, the conductor is not limited to the electric wire, and the conductor may have a plate-like shape or the like.

The electric wire 132 causes the parasitic oscillation mainly at 10 MHz or higher because of the inductance in proportion to its length or the distributed constant circuit. This is because the length of the electric wire 132 is several mm to several m, and the electric wire having a length of several m functions as the oscillator of the distributed constant type at approximately 10 MHz. The wiring causes the parasitic oscillation because of the inductance in proportion to the length of the wiring of the oscillation element 100 or the distributed constant circuit. In a case where the length of the wiring is approximated to the length of the diagonal line of the semiconductor die (substrate 105) having the necessary and sufficient size for creating the oscillation element 100, the frequency of the parasitic oscillation is set to be higher than or equal to a value obtained by diving the speed C of the electromagnetic wave in the wiring by the length d of the diagonal line of the semiconductor die 105 (C/d). The speed C of the electromagnetic wave in the wiring is slower than the speed $C_0$ of the electromagnetic wave in vacuum. When a relative dielectric constant of the semiconductor die 105 is set as $\in_r$, the speed C of the electromagnetic wave in a case where the wiring is located on the surface of the semiconductor die 105 is represented by Expression (2).

[Math. 1]

$$C = C_0 \bigg/ \sqrt{\frac{1+\varepsilon_r}{2}} \qquad (2)$$

In this manner, since the parasitic oscillation derived from the wiring differs depending on the size of the oscillation element 100, the frequency $f_1$ is preferably appropriately determined to be lower than the resonant frequency of the parasitic distributed constant type that may be generated in the semiconductor die 105. The frequency $f_1$ is set so as to satisfy Expression (3).

[Math. 2]

$$f_1 < C_0 \bigg/ \left( d \times \sqrt{\frac{1+\varepsilon_r}{2}} \right) \qquad (3)$$

For example, in a case where the oscillation element 100 has the semiconductor die smaller than or equal to 20 mm×20 mm, when it is assumed that the length of the wiring is the same as the diagonal line, the distributed constant oscillator at approximately 3 GHz or higher is obtained. In the case of the oscillation element that oscillates the terahertz wave, the oscillation element typically includes the semiconductor die smaller than or equal to 20 mm×20 mm at a maximum, the frequency $f_1$ is preferably set to be lower than 3 GHz.

When the structure in which the conductor 104 and the conductor 106 are capacitively coupled to each other is used as the resonator 110 including the part of the bias supply unit, and the frequency $f_1$ is set to be lower than a frequency $f_2$, the parasitic oscillation of the latter can be avoided. For that reason, the frequency $f_1$ may be arbitrarily set as long as the value is lower than the frequency $f_2$. In addition, in a case where the conductive layer 103 and the conductive layer 104 are arranged on the substrate 105 opposite each other as in the present exemplary embodiment, the capacitance that can be integrated on the same substrate 105 is approximately 100 nF at a maximum. For that reason, the frequency $f_1$ is preferably selected to be 100 MHz or higher. According to the present exemplary embodiment, the case in which the frequency $f_1$ is set at approximately 1 GHz will be described as an example.

A method of decreasing the frequency $f_1$ includes a method of increasing the capacitance C of the resonator 110. Although it depends on the configuration of the resonator 110 and the shape of the resonance region 108, typically, the frequency $f_1$ can be achieved at approximately 1 GHz when the capacitance C is 0.1 nF or higher with respect to the oscillator having the lowest order frequency $f_{osc}$ at 0.1 THz or lower. In addition, the frequency $f_1$ can be achieved at approximately 1 GHz when the capacitance C is 1 nF or higher with respect to the oscillator having the frequency $f_{osc}$ at 1 THz or lower, and the frequency $f_1$ can be achieved at approximately 1 GHz when the capacitance C is 10 nF or higher with respect to the oscillator having the frequency $f_{osc}$ at 10 THz or lower.

This is because, although it depends on the configuration or the shape, the inductances of the two conductors 104 and 106 that constitute the resonator 110 have an order of an inverse number of the frequency $f_{osc}$ in The International System of Units. That is, the resonator 110 having the frequency $f_{osc}$ at 0.1 THz has the order of 10 pH, and the resonator 110 having the frequency $f_{osc}$ at 1 THz has the order of 1 pH. The resonator 110 having the frequency $f_{osc}$ at 10 THz has the order of 0.1 pH, and the necessary capacitance C differs depending on the parallel resonant frequency $f_{osc}$.

Figure 3:
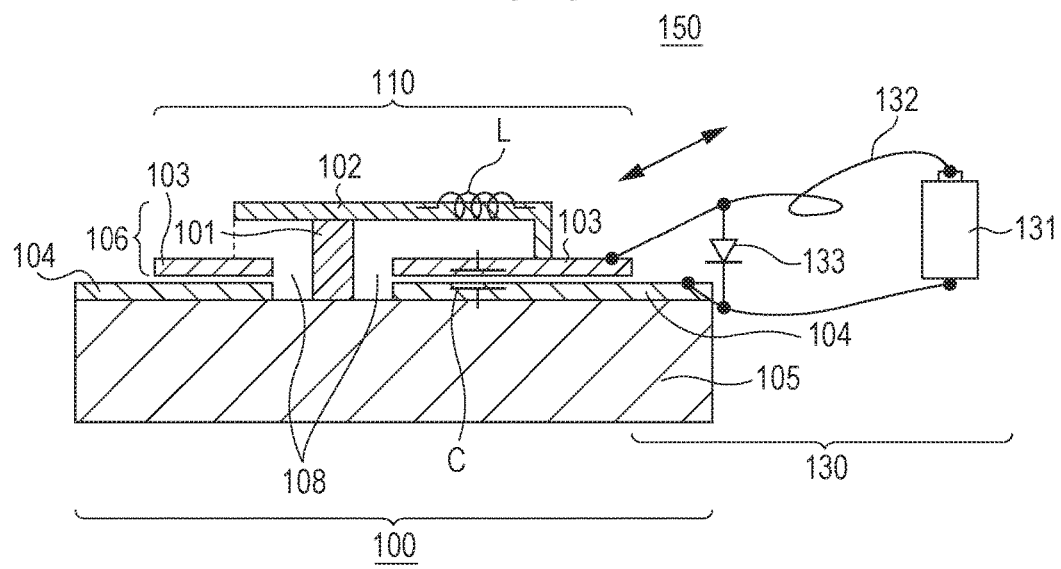
FIG. 3 is a schematic diagram of an oscillator using the oscillation element according to the first exemplary embodiment.

An oscillator 150 using the oscillation element 100 according to the present exemplary embodiment will be described with reference to FIG. 3. FIG. 3 is an explanatory diagram for describing a configuration of the oscillator 150. It is possible to suppress the parasitic oscillation in the frequency region that is higher than or equal to $f_1$ and lower than $f_{osc}$ by using the oscillation element 100. Furthermore, the oscillator 150 is provided with a configuration for suppressing the parasitic oscillation in the frequency region that is higher than or equal to DC and lower than $f_1$.

The oscillator 150 includes the oscillation element 100 and a power circuit 130 (hereinafter, will be referred to as "circuit 130"). The circuit 130 includes the power supply 131 that supplies the bias voltage to the oscillation element 100 and the electric wire 132, and the parasitic oscillation may be induced in the frequency region that is higher than or equal to DC and lower than $f_1$, in particular, the frequency region that is higher than or equal to 10 MHz and lower than $f_1$. According to the present exemplary embodiment, a shunt rectifier diode (shunt element) 133 (hereinafter, will be referred to as "diode 133") is arranged in a location of the electric wire having ¼ or smaller of the wavelength corresponding to $f_1$=1 GHz, that is, having 7.5 cm or shorter towards the power supply side as seen from the oscillation element 100. In other words, the diode 133 and the electric wire 132 are connected to each other between the power supply 131 and the oscillation element 100. The length of the electric wire 132 in the location where the electric wire 132 and the oscillation element 100 are connected to each other and the diode 133 is 7.5 cm or shorter.

When this method is used, the amplitude of the parasitic oscillation in the frequency region that is higher than or equal to DC and lower than $f_1$ can be attenuated. The insertion of the diode 133 is equivalent to the decrease in a Q value of a resonance at a parallel resonance point of a loop 120 on the Smith chart in FIG. 2F. As a result, the loop 120 edges closer to the left side on the same chart. For that reason, with the oscillator 150 according to the present exemplary embodiment, only the parasitic low-frequency oscillation can be suppressed without attenuating the amplitude of the terahertz wave at the desired frequency $f_{osc}$. The configuration is not limited to the rectifier diode, and a shunt element including a resistor or the like can attain the same effect.

Alternatively, an oscillator (not illustrated) obtained by putting the oscillation element 100 using a short electric wire (not illustrated) having 7.5 cm or shorter which is sufficiently smaller than ¼ of the wavelength corresponding to the waveform corresponding to $f_1=1$ GHz or smaller and the power circuit 130 into a module may be configured. With this method too, it is possible to suppress the parasitic low-frequency oscillation without attenuating the amplitude of the terahertz wave at the desired frequency $f_{osc}$. The method of suppressing the parasitic oscillation in the frequency region that is higher than or equal to DC and lower than $f_1$ is not limited to this, and various methods can be applied to the method.

The oscillation element 100 according to the first exemplary embodiment and the oscillator 150 using the oscillation element 100 have been described above. With the oscillation element 100, it is possible to provide the oscillation element and the oscillator in which the frequency range where the parasitic oscillation is to be attenuated can be further narrowed down than the related art technology. In particular, the oscillation element 100 can suppress the parasitic oscillation in the frequency region that is higher than or equal to the frequency $f_1$ and lower than the frequency $f_{osc}$. That is, when the oscillator is configured by using the oscillation element according to the present exemplary embodiment, since the parasitic oscillation in the frequency region that is higher than or equal to $f_1$ and lower than $f_{osc}$ is suppressed by the oscillation element, the band where the amplitude of the parasitic oscillation is to be attenuated is narrowed down by the configuration of the power supply circuit or the like. For that reason, the suppression of the parasitic oscillation is facilitated, and it is possible to further suppress the attenuation of the oscillation at the desired frequency $f_{osc}$.

Second Exemplary Embodiment

Figure 4:
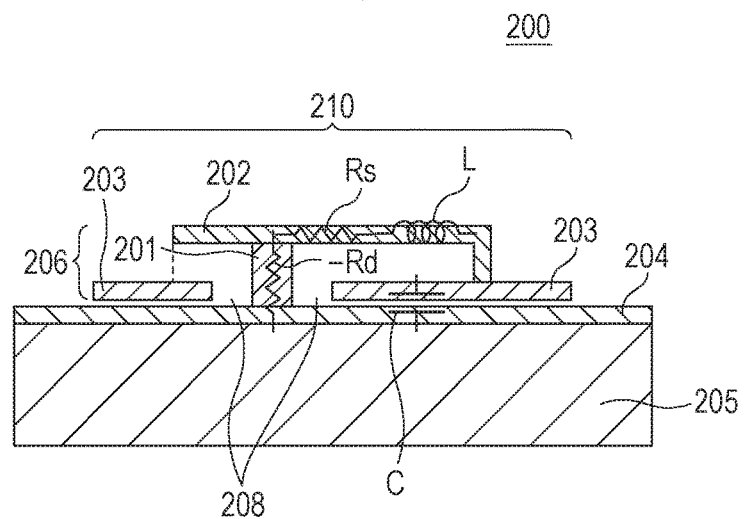
FIG. 4 is a cross sectional view of a part of an oscillation element according to a second exemplary embodiment.

An oscillation element 200 according to the present exemplary embodiment will be described by using FIG. 4. FIG. 4 is a cross sectional view of the oscillation element (semiconductor die) 200.

The oscillation element 200 includes a negative resistance element 201 (hereinafter, will be referred to as "element 201") and a resonator 210. The element 201 and the resonator 210 are arranged on a substrate 205. The resonator 210 includes a first conductor 206 (hereinafter, will be referred to as "conductor 206") which includes a first conductive layer 202 (hereinafter, will be referred to as "conductive layer 202"), and also a second conductive layer 203 (hereinafter, will be referred to as "conductive layer 203") and a second conductor 204 (hereinafter, will be referred to as "conductor 204") provided with a third conductive layer. The element 201 is electrically connected to each of the conductors 204 and 206. It is noted that the conductor 204 may be referred to as the conductive layer 204 in some cases in the following explanation.

The substrate 205 is in contact with the conductive layer 204. One pole of the element 201 is supplied with the bias voltage via the conductor 204. The conductive layer 202 and the conductive layer 203 are electrically short-circuited and connected to each other and form the other pole of the element 201. That is, the conductive layers 202 and 203 can be treated as a single conductor having a common potential, and the other pole of the element 201 is supplied with the bias voltage via the conductor 206.

The resonator 210 is the oscillator of the distributed constant type which includes a region 208 formed by being surrounded by the conductive layer 202, the conductive layer 203, and the conductive layer 204. It is noted that the region 208 may be hollow or may be filled with the dielectric. According to the present exemplary embodiment, among the oscillators of the distributed constant type, the element 201 sandwiched between the conductive layer 202 and the conductive layer 204 forms an oscillator of a waveguide type which extends in a direction perpendicular to the paper surface of FIG. 4.

Therefore, the inductance $L_1$ of the oscillator which is derived from the conductive layer 202 and a series resistance $R_s$ can be set to be smaller as compared with the first exemplary embodiment without changing the product of a junction capacitance Cd of the element 201 and a negative differential resistance $-R_d$ ($R_d>0$) of the element 201. It is however noted that, in the low-frequency region where the entire structure of the oscillation element can be represented by a lumped constant element, it is difficult to satisfy Expression (4) corresponding to the sufficient condition for the amplitude attenuation because of the following reason. It is noted that Expression (4) can be obtained by solving a differential equation.

$$R_d > R_s > L/C_d R_d \qquad (4)$$

Although it depends on a type of the element 201, in a typical element of the oscillation element that oscillates the terahertz wave, the product of $C_d R_d$ without depending on the shape becomes approximately $10^{-11}$ sec in an Esaki diode and becomes approximately $10^{-12}$ sec in a resonant tunneling diode. The typical series resistance $R_s$ in the case of the resonator 210 of the waveguide type is typically from approximately 0.1Ω to approximately 1Ω. Therefore, in a case where the element 201 is the resonant tunneling diode, the inductance $L_1$ of the resonator 210 is demanded to be $10^{-12}$ H or higher and $10^{-13}$ H or lower, and in a case where the element 201 is the Esaki diode, the inductance $L_1$ is demanded to be $10^{-11}$ H or higher and $10^{-12}$ H or lower. However, it is not simple to design the above-described small inductance structure.

However, without satisfying Expression (4), it is sufficient if decoupling occurs in the capacitance C between the conductive layer 203 and the conductive layer 204 which are arranged opposite each other, and a part of the resonator 210 on an inner side as seen from the element 201 takes the following configuration.

The respective impedances of the conductive layers 202, 203, and 204 alternately repeat the series resonance and the parallel resonance on the frequency axis. According to this, the phase matching does not occur in principle in the band that is higher than or equal to the frequency $f_1$ and lower than the frequency $f_{osc}$ of the resonator 210. For that reason, the parasitic oscillation is suppressed in the frequency region that is higher than or equal to $f_1$ and lower than $f_{osc}$. This is the same as the description made with reference to FIGS. 2A to 2F according to the first exemplary embodiment. Therefore, in the frequency region that is higher than or equal to DC and lower than or equal to $f_1$, when a part of a lumped constant circuit on the power supply side where the resonator 210 is not included adopts a configuration in which the sufficient condition for the amplitude attenuation in the low-frequency region is satisfied, as a result, it is possible to suppress the parasitic oscillation in the frequency region that is higher than or equal to DC and lower than $f_{osc}$.

According to the present exemplary embodiment, the frequency $f_1$ is set to be lower than or equal to 200 MHz. This is because an upper limit of the frequency at which the power supply circuit can be regarded as the lumped constant element instead of the distributed constant circuit is 200 MHz.

Since the value of the frequency $f_1$ is low, the demanded capacitance C is relatively large. Since the resonator 210 according to the present exemplary embodiment has the structure of the waveguide type which extends in a direction perpendicular to the paper surface of FIG. 4, it is simple to form the relatively large capacitance C between the conductive layer 203 and the conductive layer 204 which are arranged to face each other and are capacitively coupled to each other, and this configuration is preferably adopted according to the present exemplary embodiment. Similarly as in the first exemplary embodiment, since the capacitance that can be integrated on the same substrate 205 is approximately 100 nF at a maximum, the frequency $f_1$ is more preferably set to be 100 MHz or higher.

Figure 5:
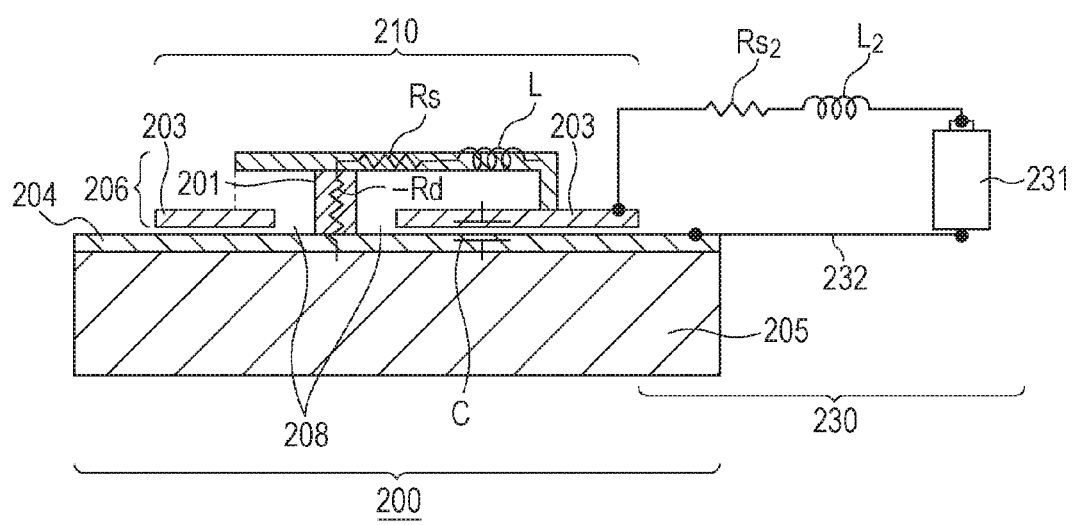
FIG. 5 is a schematic diagram of an oscillator using the oscillation element according to the second exemplary embodiment.

An oscillator 250 using the oscillation element 200 according to the present exemplary embodiment will be described with reference to FIG. 5. FIG. 5 illustrates a configuration of the oscillator 250. The oscillator 250 includes the oscillation element 200 and a power supply circuit 230 (hereinafter, will be referred to as "circuit 230"). The circuit 230 includes a power supply 231 and an electric wire 232, and the parasitic oscillation may be induced particularly in the frequency region that is higher than or equal to 10 MHz among the frequency region that is higher than or equal to DC and lower than $f_1$.

In view of the above, according to the present exemplary embodiment, the shunt element is connected to the electric wire 232 that connects the oscillation element 200 to the power supply 231 to suppress the parasitic oscillation. In the wavelength region where the resonator 210 can be considered to be sufficiently small, that is, the low-frequency region where the entire structure can be represented by the lumped constant element, when the sufficient condition for the amplitude attenuation in Expression (4) is expanded, the following Expression (5) is established.

$$R_d > R_{s2} > L_2/(C_d+C)R_d \quad (5)$$

The series resistance $R_s$ of the resonator 210 which is derived from the conductive layer 202 and the inductance $L_1$ are respectively replaced by the series resistance $R_{s2}$ and the inductance $L_2$ of the electric wire 232. The junction capacitance Cd of the element 201 is replaced by a sum of the junction capacitance Cd and the capacitance C, that is, $C_d+C$. Since the decoupling capacitance C is overwhelmingly larger than $C_d$, an approximation of $C_d+C=C$ is established.

Herein, the capacitance C can be adjusted by the area of the part where the conductive layer 203 and the conductive layer 204 are arranged opposite each other. In addition, the negative resistance $-R_d$ ($R_d>0$) can be adjusted by the width of the waveguide of the element 201. For that reason, the significant delay can be realized to set the product of $CR_d$ as $10^{-7}$ sec or the like by way of the design of the oscillation element 200. When the series resistance $R_{s2}$ uses the electric wire 232 at 0.1Ω, the demand for the inductance $L_2$ of the electric wire 232 is $10^8$ H or lower. The design of the electric wire 232 having the series resistance $R_{s2}$ and the inductance $L_2$ described above is simple.

When the sufficient condition for the amplitude attenuation which is illustrated in Expression (5) is satisfied, the loop 22 on the Smith chart in FIG. 2F becomes smaller and also edges closer to the left side or the bottom side on the same chart. That is, when the oscillator 250 is configured by using the oscillation element 200, the parasitic oscillation in the frequency region that is higher than or equal to $f_1$ and lower than $f_{osc}$ can be suppressed by the oscillation element 200. For that reason, it is possible to provide the oscillation element and the oscillator in which the frequency range where the parasitic oscillation is to be attenuated can be further narrowed down than the related art technology.

In particular the oscillation element 100 can suppress the parasitic oscillation in the frequency region that is higher than or equal to the frequency $f_1$ and lower than the frequency $f_{osc}$. Thus, when the oscillator is configured by using the oscillation element according to the present exemplary embodiment, since the parasitic oscillation in the frequency region that is higher than or equal to $f_1$ and lower than $f_{osc}$ is suppressed by the oscillation element, the band where the amplitude of the parasitic oscillation is to be attenuated is narrowed down by the configuration of the power supply circuit or the like. For that reason, the suppression of the parasitic oscillation is facilitated, and it is possible to further suppress the attenuation of the oscillation at the desired frequency $f_{osc}$.

EXAMPLE 1

Figure 6A:
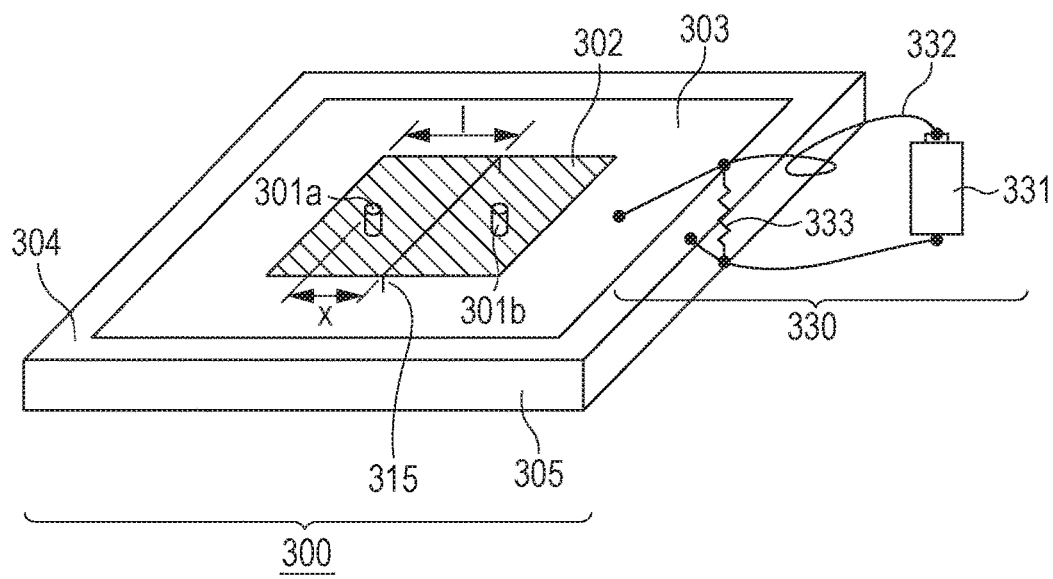
FIG. 6A is a schematic diagram of an oscillator according to Example 1.
Figure 6B:
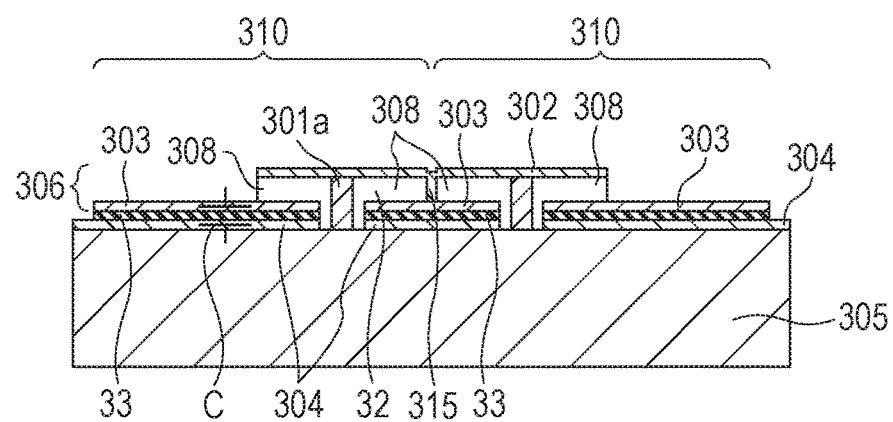
FIG. 6B is a cross sectional view of an oscillation element according to Example 1.

An oscillator 350 according to Example 1 will be described. FIG. 6A is a schematic diagram of the oscillator 350, and FIG. 6B is a cross sectional view of the oscillation element.

The oscillator 350 uses resonant tunneling diodes as negative resistance elements 301a and 301b. According to the present example, since two resonators 310 of the distributed constant type are used, two RTD 301a and 301b are provided. The resonators 310 each include a first conductor 306 (hereinafter, will be referred to as "conductor 306") and a second conductor 304 (hereinafter, will be referred to as "conductor 304").

A first conductive layer 302, a second conductive layer 303, and the third conductive layer (second conductor) 304 are each a metallic layer using Ti/Pd/Au metal having a thickness of 200 nm. Hereinafter, these conductive layers are respectively referred to as metallic layer (first metallic layer) 302, metallic layer (second metallic layer) 303, and metallic layer (third metallic layer) 304. A substrate 305 is a conductive n-InP substrate. The conductor 304 is arranged on the substrate 305 that is in contact with the metallic layer 304 and supplies the bias voltage to one pole of each of the RTD 301a and 301b.

In the conductor 306 arranged opposite the conductor 304, a dielectric benzocyclobutene (BCB) 32 is arranged between the metallic layer 302 and the metallic layer 303. The metallic layer 302 and the metallic layer 303 are electrically short-circuited and connected to each other in a BCB channel part 315 and form the other pole of the negative resistance element 301.

The two resonators 310 include regions surrounded by the metallic layers 302, 303, and 304 and are separated from each other by a metal filled in the BCB channel part 315. A region 308 of each of the resonators 310 serves as a single resonance region of a distributed constant type, and the electromagnetic wave at a wavelength λ that satisfies $l_1=λ/4$ is resonated in accordance with a distance (length of the resonator 310) $l_1$ between the BCB channel part 315 and an end part on the opposite side to the BCB channel part 315 of the metallic layer 302.

The wavelength λ herein is not a wavelength $λ_0$ in vacuum but is an effective wavelength on which the wavelength shortening effects are received by the effects of a dielectric constant of the BCB 32 and the shapes of the metallic layer 302 and the metallic layer 303. Therefore, the metallic layers 302 and 303 that surround the resonant region 308 and the metallic layer 304 have an inverted-F antenna structure. The two resonators 310 have symmetrical shapes to each other while the BCB channel part 315 is set as the center. This is because a coupled oscillation is mutually performed at a certain oscillation frequency. The oscillators having different shapes may be used as the resonator 310, and the oscillator on one side may be omitted.

According to the present example, a silicon nitride (SiN) film 33 having a thickness of 100 nm is provided between the metallic layer 303 and the metallic layer 304 to form the capacitance C. The frequency $f_1$ ($f_1=1/\{2\pi\sqrt{(L_1C)}\}$) based on the inductance $L_1$ of the resonator 310 which is derived from the metallic layer 302 and the capacitance C between the metallic layer 303 and the metallic layer 304 exists between both poles of the RTD 301a and 301b. The frequency $f_1$ can be adjusted to be lower than a predetermined frequency by adjusting the area where the metallic layer 303 and the metallic layer 304 are overlapped with each other.

Each of the RTD 301a and 301b is constituted by including a multiquantum well structure based on InGaAs/InAlAs and InGaAs/AlAs on the InP substrate 305. A triple-barrier structure is used herein as the multiquantum well structure. More specifically, the multiquantum well structure is configured by a semiconductor multilayer film structure of AlAs (1.3 nm)/InGaAs (7.6 nm)/InAlAs (2.6 nm)/InGaAs (5.6 nm)/AlAs (1.3 nm). Among those, InGaAs is a well layer, and lattice matching InAlAs and non-matching AlAs are barrier layers. These layers are set as undoped layers where carrier doping is not intentionally performed.

The above-described multiquantum well structure is sandwiched by electric contact layers based on n-InGaAs where an electron concentration is $2\times10^{18}$ cm$^{-3}$. In a current voltage I (V) characteristic of the structure between the above-described electric contact layers, a peak current density is approximately 280 kA/cm$^2$, and the negative differential resistance region corresponds to a range from approximately 0.7 V to approximately 0.9 V. According to the present example, a mesa structure having a diameter of 2 μmΦ is used as the RTD 301a. A peak current 10 mA and the negative differential resistance −20Ω are obtained for each of the RTDs 301a and 301b.

The metallic layer 302 is a resonance circuit for the terahertz wave which uses an inverted-F antenna, and according to the present example, the length $l_1$ of the resonator 310 in which the resonant frequency is designed to be at approximately 0.6 THz is 75 μm, and a length in a direction perpendicular to this (hereinafter, will be referred to as vertical direction) is 150 μm. The RTD 301a is arranged on an outer side with respect to the BCB channel part 315 in a direction orthogonal to the vertical direction (hereinafter, will be referred to as horizontal direction) by x=40 μm.

A thickness of the BCB 32 is approximately 3 μm according to the present example. The oscillation frequency $f_{osc}$ is approximately 0.5 THz by being shifted from the resonant frequency in each of the resonance regions 308 by the amount corresponding to the reactances of the RTD 301a and 301b where the influence is increased in the terahertz waveband. Each of the above-described dimensions is a design element and can be appropriately changed in accordance with the desired oscillation frequency $f_{osc}$, the power, the power efficiency, or the like.

The area where the metallic layer 303 and the metallic layer 304 are overlapped with each other is set as approximately 0.75 mm×approximately 0.75 mm according to the present example. When the capacitance C=approximately 0.33 nF between the metallic layer 303 and the metallic layer 304 is secured by using the above-described units, the above-described frequency $f_1$ becomes approximately 3 GHz. In this manner, the oscillator 350 using an oscillation element 300 can narrow the frequency region where the parasitic oscillation is to be suppressed down to the frequency region that is higher than or equal to DC and lower than 3 GHz.

The oscillation element 300 can be manufactured by the following manufacturing method. First, a semiconductor multilayer film is subjected to epitaxial growth on the n-InP substrate 305 by a molecular beam epitaxy (MBE) method, a metal organic vapor phase epitaxy (MOVPE) method, or the like. That is, the RTD structure based on n-InP/n-InGaAs, InGaAs/InAlAs and n-InGaAs are sequentially subjected to epitaxial growth. Next, the RTD 301 is etched into a circular mesa shape. Dry etching based on electron beam (EB) lithography and inductive coupled plasma (ICP) is used for the etching. Photolithography may be used instead.

Subsequently, the Ti/Pd/Au metallic layer (third metallic layer) 304 is formed on the etched surface by a lift-off method, and a film of the silicon nitride layer 100 nm is formed by using a spattering method. The film formation is preferably performed when a plasma CVD method is used because passivation for protecting a side wall in the RTD 301 is also realized at the time. Furthermore, the Ti/Pd/Au metallic layer (second metallic layer) 303 is formed by the lift-off method, and the capacitance C is completed. The unnecessary silicon nitride layer that does not contribute to the capacitance is removed by etching by using a pattern similar to the second metallic layer 303.

Thereafter, embedding of the RTD 301 is performed by the BCB 32 serving as the dielectric, and flattening is performed until the uppermost surface layer of the RTD 301 is exposed. Subsequently, only the BCB channel part 315 of the Ti/Pd/Au metallic layer (second metallic layer) 303 is exposed by using dry etching. At this time, when etching is performed by using dry etching while oxygen is mixed into etching gas and photoresist is retreated, the BCB channel part 315 is set to have a forward tapered shape. Finally, the Ti/Pd/Au metallic layer (first conductive layer) 302 is formed by the lift-off method, and the dielectric the BCB 32 is removed, so that the oscillation element according to the present example 300 is completed.

The first exemplary embodiment may be used for the oscillator 350 in which a power supply circuit 330 (hereinafter, will be referred to as "circuit 330") is connected to the oscillation element 300. A voltage supply at approximately 0.8 V is prepared as a power supply 331 included in the circuit 330 such that the negative differential resistance region of the RTD 301a and 301b can be biased at a voltage from approximately 0.7 V to approximately 0.9 V. An electric wire 332 may be respectively connected to the metallic layer 303 and the metallic layer 304 by using wire bonding or the like, and any connecting locations may be used. For example, the electric wire 332 may be connected to the metallic layer 303 and the metallic layer 304 in the vicinity of the end part of the oscillation element (semiconductor die).

A shunt resistor (shunt element) 333 is arranged within approximately 2.5 cm towards the power supply 331 side from the location where the electric wire 332 is connected to the metallic layer 303 or the metallic layer 304. To more simply realize this configuration, an integrated resistor may be provided between the metallic layer 303 and the metallic layer 304 in the connecting location. When a resistant value of the shunt resistor 333 is lower than or equal to approximately 10Ω that is equal to the absolute value of a combined resistance of the two negative resistance elements 301a and 301b at approximately −10Ω, the parasitic oscillation in the frequency region that is higher than or equal to DC and lower than 3 GHz can be reliably suppressed.

Figure 7A:
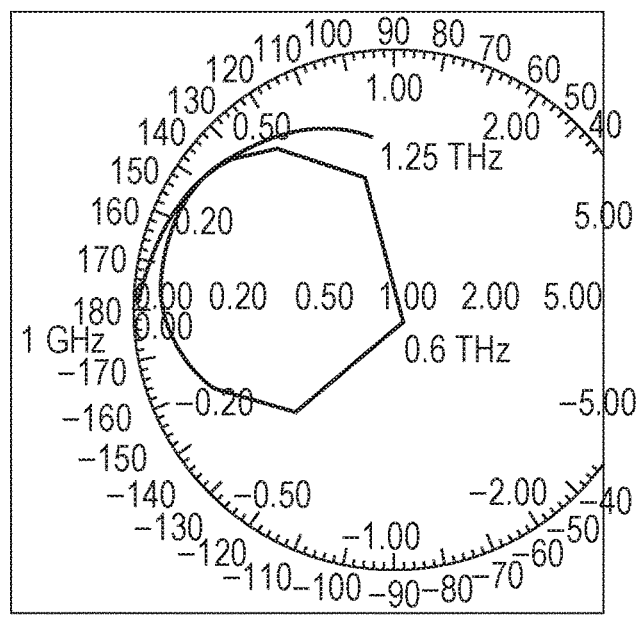
FIG. 7A is a Smith chart as a simulation result of the oscillation element according to Example 1.
Figure 7B:
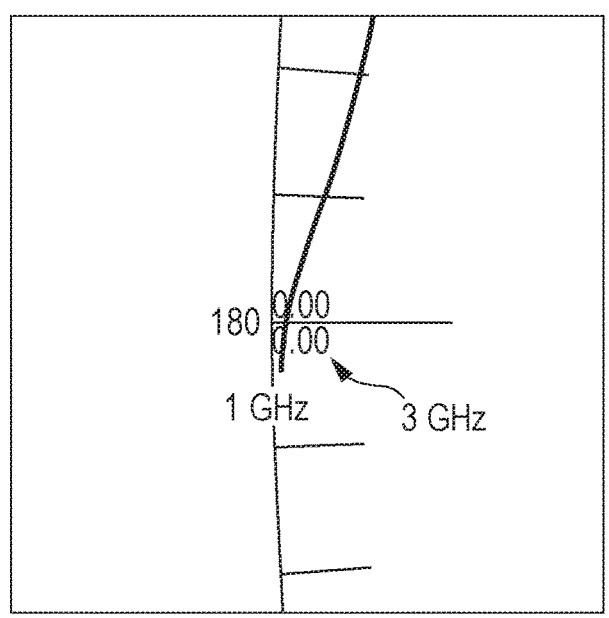
FIG. 7B is an expanded view in the vicinity of 1 GHz in the Smith chart of the oscillation element according to Example 1.

FIG. 7A and FIG. 7B illustrate simulation calculation results of the oscillation element 300. FIG. 7A is a Smith chart in which the impedance of the oscillator that also serves as a bias supply structure on an outer side with respect to both end parts of the RTD 301a and 301b is plotted from approximately 1 GHz to approximately 1200 GHz. FIG. 7B is an expanded view in the vicinity of 1 GHz in the Smith chart of FIG. 7A.

It may be understood from FIG. 7A and FIG. 7B that an intersecting point of a straight line where the reactance of the Smith chart (imaginary part of the impedance) is zero and a curved line indicating a frequency dependency of the impedance of the resonator 310 is 3 GHz. That is, it may be understood that the series resonance point of the resonator 310 has a frequency of approximately 3 GHz, and the next resonance point is approximately 0.6 THz corresponding to the lowest order parallel resonance point of the resonator 310. A high-frequency electromagnetic field simulator HFSS ver. 13 based on a three-dimensional finite element method which is manufactured by Ansys Inc. is used for the simulation.

With the oscillation element according to the present example, the frequency range where the parasitic oscillation is to be attenuated can be further narrowed down than the related art technology.

EXAMPLE 2

Figure 8A:
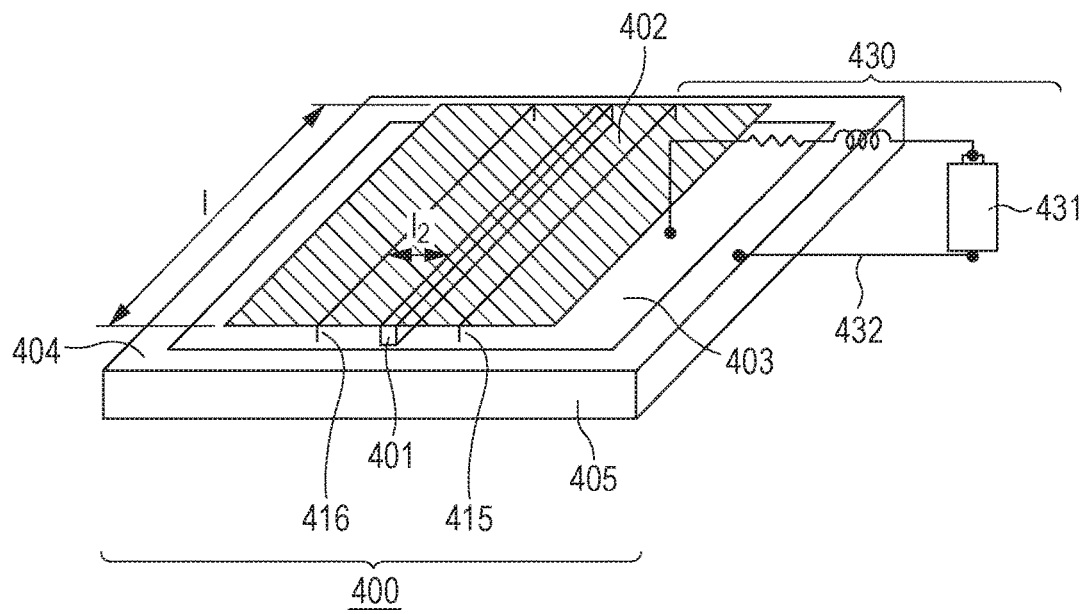
FIG. 8A is a schematic diagram of an oscillator according to Example 2.
Figure 8B:
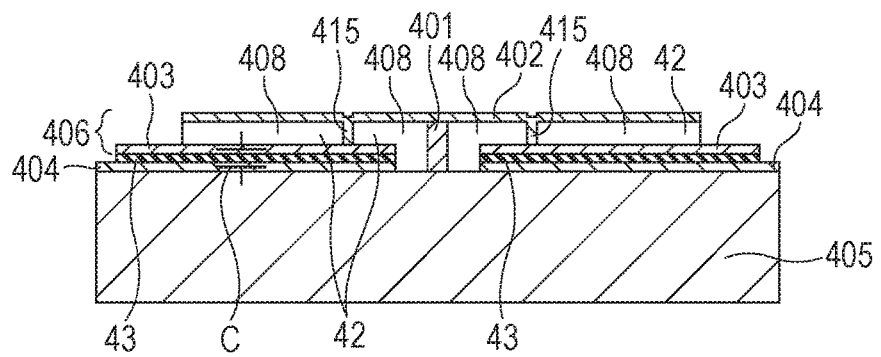
FIG. 8B is a cross sectional view of an oscillation element according to Example 2.
Figure 9:
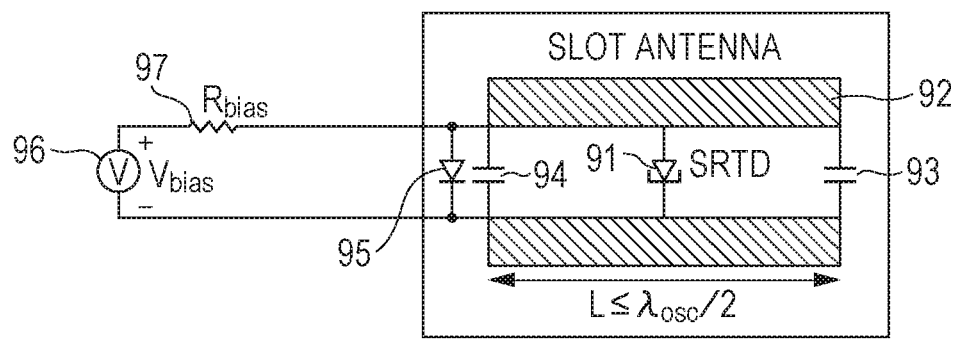
FIG. 9 is a schematic diagram of a configuration of an oscillator according to a related art technology.

An oscillation element 400 and an oscillator 450 according to Example 2 will be described. FIG. 8A is a schematic diagram of the oscillator 450, and FIG. 8B is a cross sectional view of the oscillation element 400.

A negative resistance element 401 according to the present example is a resonant tunneling diode (hereinafter, will be referred to as "RTD 401"). A difference from Example 1 resides in that a shape of the RTD 401 is not the mesa shape but is a stripe appearance. According to the present example, a resonator 410 of a distributed constant type is an oscillator of a gain waveguide type along a longitudinal direction of the stripe shaped element 401 (hereinafter, will be referred to as the vertical direction), and the electromagnetic wave is distributed as a standing wave as a loop, a node, a loop, and the like in the resonator 410. Since an end face is an open end, the loop of the electric field of the electromagnetic wave exists in the open end.

According to the present example, since both ends are open ends, when a length of a first metallic layer (first conductive layer) 402 (hereinafter, will be referred to as "metallic layer 402") in the vertical direction is set as $l_3$, the lowest order resonance is an electromagnetic wave at a wavelength that satisfies $l_3=\lambda/2$. The secondary resonance is an electromagnetic wave at a wavelength that satisfies $l_3=2\times\lambda/2$, and the tertiary resonance is an electromagnetic wave at a wavelength that satisfies $l_3=3\times\lambda/2$. Therefore, as the order is increased, the resonant frequency is increased.

A metallic layer 402, a second metallic layer (second conductive layer) 403 (hereinafter, will be referred to as "metallic layer 403"), a third metallic layer (third conductive layer) 404 (hereinafter, will be referred to as "metallic layer 404"), and an n-InP substrate 405 which are the other constituting components are similar to those according to Example 1. The RTD 401 sandwiched by the two metallic layers as illustrated in the second exemplary embodiment may be used, and the substrate 405 at that time may not be a lattice matching system with the RTD 401.

The metallic layer 402 and the metallic layer 403 sandwich a BCB 42 serving as a dielectric and are also electrically short-circuited and connected to each other in the BCB channel parts 415 and 416. The wavelength λ is not a wavelength $\lambda_0$ in vacuum but is an effective wavelength on which the wavelength shortening effects are received by the effects of a dielectric constant of the BCB 42 and the shapes of the metallic layer 402 and the metallic layer 403.

Since the resonator 410 is of the gain waveguide type, the resonator 410 also depends on the semiconductor multilayer film of the RTD 401 in addition to the shapes of the metallic layer 402 and the metallic layer 403 and has a relatively strong wavelength shortening effect. This is because a TMO mode in the RTD 401, that is, a semi-TEM mode is selected as a waveguide mode. In the case of the present example, the resonator 410 is filled with the BCB 42 and is also closed by the BCB channel parts 415 and 416. Therefore, a TE mode in which a magnetic line has a component $H_z$ in the vertical direction is established in the region filled with the BCB 42.

Therefore, a distance $l_2$ between the RTD 401 and the BCB channel parts 415 and 416 is designed as follows. First, the component $H_z$ in the vertical direction of the magnetic line and the above-described component $E_x$ of an electric flux line that vertically and horizontally intersects can be represented as Expression (6) and Expression (7) in the side wall region where the BCB 42 is filled. Herein, a longitudinal direction of the negative resistance element 401 (vertical direction) is set as a Z direction, and a direction intersecting with this is set as a y direction (horizontal direction). In Expression (6) and Expression (7), the component $H_z$ in the vertical direction and the component $E_x$ are expressed by way of general solution formats accompanied by coefficients A and B while an imaginary unit is set as j, an oscillation number of the electromagnetic wave is set as ω, a time oscillation component by a time t is set as exp (jωt), a wave number in the y direction is set as $\beta_y$, and a wave number in the z direction is set as $\beta_z$.

$$H_z = A\exp(j\omega t + j\beta_z z + j\beta_y y) + B\exp(j\omega t + j\beta_z z - j\beta_y y) \quad (6)$$

$$E_x = \omega\mu\beta_y/(k_0^2 - \beta_z^2) \times \{A\exp(j\omega t + j\beta_z z + j\beta_y y) + B\exp(j\omega t + j\beta_z z - j\beta_y y)\} \quad (7)$$

It is noted that, according to the present example, A=B is established since the structure is symmetrical in the y direction. From Expression (6) and Expression (7), the wave number $\beta_y$ in the y direction has a relationship with the wave number $\beta_z$ in the z direction as represented by Expression (8).

$$\beta_y^2 = k_0^2 - \beta_z^2 \quad (8)$$

In the case of the present example in which the wave shortening $\beta_z/k_0$ is relatively large, since the first term in the right side is sufficiently smaller than the second term, the relationship can be represented as Expression (9).

$$\beta_y^2 = -\beta_z^2 \quad (9)$$

Therefore, since the spread of the electromagnetic wave in the y direction is approximately $1/\beta_z$ by using the wave number in the z direction, the oscillation in the waveguide mode at the desired wave number $\beta_z$ can be performed when $l_2 > 1/\beta_z$ is designed. In the case of the lowest order resonance, since $l_3 = \lambda/2 = \pi/\beta_z$ is established, a design for establishing $l_2 > l_3/\pi$ is preferably prepared. A typical aspect ratio of $l_2$:1 is 1:3 or lower. In this manner, the inductance $L_1$ has a lower limit since $l_2$ is not to be designed to be small, but the frequency $f_1$ can be adjusted by adjusting the area where the metallic layer 403 and the metallic layer 404 are overlapped with each other.

According to the present example, the oscillation element of the gain waveguide type at the oscillation frequency of 0.3 THz is designed such that the length $l_3$ of the first metallic layer 402 in the vertical direction is set as approximately 100 µm, and the distance $l_2$ between the RTD 401 and the BCB channel parts 415 and 416 is set as approximately 35 µm. Since the power is supplied from the two locations including the BCB channel parts 415 and 416, the counts of the inductance $L_1$ of the resonator 410 which is derived from the metallic layer 402 and the series resistance $R_s$ are reduced by half. However, the inductance $L_1$ in the order of $10^{-11}$ H remains.

Therefore, the design is made such that the area where the second metallic layer 403 and the third metallic layer 404 constituting the resonator 410 are overlapped with each other is adjusted, and the capacitance C can secure, for example, 10 nF. Specifically, a hafnium film 43 having an overlapped area of approximately 0.1 mm×approximately 5 mm and a thickness of approximately 20 nm is used. When the capacitance C is secured by using the above-described configuration, the frequency $f_1$ becomes 500 MHz. In this manner, when the oscillation element 400 is used, the band where the parasitic oscillation is to be suppressed can be narrowed down to the frequency region that is higher than or equal to DC and lower than $f_1$=500 MHz.

The second exemplary embodiment may be used for the oscillator 450 in which the power supply circuit is connected to the oscillation element 400. A power supply 431 prepares a voltage source at approximately 0.8 V such that the negative resistance region of the RTD 401 can be biased to approximately 0.7 V to approximately 0.9 V. An electric wire 432 uses a relatively thick electric wire in which the series resistance $R_{s2}$ is approximately 0.1Ω to set the demand for the inductance $L_2$ to be $10^{-8}$ H or lower. Therefore, the electric wire 432 and the oscillation element 400 may be connected to each other by using wire bonding at approximately $10^{-9}$ H or the like, and a plurality of electric wires 432 may of course be used in parallel.

With this configuration, it is possible to suppress the parasitic oscillation in the frequency region that is higher than or equal to DC and lower than $f_1$=500 MHz. In addition, the power supply circuit using the shunt element according to the first exemplary embodiment may be used.

With the oscillation element according to the present example, the frequency range where the parasitic oscillation is to be attenuated can be further narrowed down than the related art technology.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, an imaging system may be constructed by including the oscillation element according to the above-described exemplary embodiments and examples and the oscillator using this oscillation element, and also an image forming apparatus configured to detect the millimeter wave and the terahertz wave as an image. Since the energy of background black-body radiation is small in the frequency region from the millimeter waveband to the terahertz band as being different from an infrared region, active illumination based on the above-described oscillation element and the oscillator is normally used.

An electronic device including a rectifier element such as a Schottky barrier diode or an FET and a thermal conversion device such as a micro bolometer, a pyrodetector, or a Golay cell may be used as the image forming apparatus using the electromagnetic wave. The terahertz wave having information of a subject which is generated from the subject irradiated and transmitted or reflected is obtained by the image forming apparatus. At that time, if an objective lens is provided between the image forming apparatus and the subject, the present imaging system corresponds to a focus plane array type, and image pickup by a single shot can be carried out.

The oscillation element according to the above-described exemplary embodiments and examples and the oscillator using this oscillation element is expected to be applied as an illumination unit that performs the active illumination based on the millimeter wave and the terahertz wave which can be used for a manufacturing management, a medical image diagnosis, a safety management, or the like, or a transmission unit of an ultra-fast communication device.

This application claims the benefit of Japanese Patent Application No. 2014-039032, filed Feb. 28, 2014 and No. 2015-023663, filed Feb. 9, 2015, which are hereby incorporated by reference herein in their entirety.

The invention claimed is:

1. An oscillation element that oscillates an electromagnetic wave, the oscillation element comprising:
    a negative resistance element; and
        a resonator including a first conductive layer, a second conductive layer, and a third conductive layer,
    wherein the first conductive layer is electrically connected to the second conductive layer,
    wherein the negative resistance element is electrically connected to the first conductive layer and the third conductive layer,
    wherein the second conductive layer and the third conductive layer are arranged opposite each other and are also capacitively coupled to each other,
    wherein the second conductive layer is arranged between the first conductive layer and the third conductive layer, and
    wherein the second conductive layer and the first conductive layer are overlapped with each other in a planar view.

2. The oscillation element according to claim 1, wherein a series resonant frequency f1 of the resonator is lower than 3 GHz.

3. The oscillation element according to claim 1, wherein a series resonant frequency f1 of the resonator is higher than or equal to 100 MHz.

4. The oscillation element according to claim 1,
    wherein an oscillation frequency $f_{osc}$ of the oscillated electromagnetic wave is lower than or equal to 0.1 THz, and
    wherein the capacitance C is higher than or equal to 0.1 nF.

5. The oscillation element according to claim 1,
    wherein an oscillation frequency $f_{osc}$ of the oscillated electromagnetic wave is lower than or equal to 1 THz, and
    wherein the capacitance C is higher than or equal to 1 nF.

6. The oscillation element according to claim 1,
    wherein an oscillation frequency $f_{osc}$ of the oscillated electromagnetic wave is lower than or equal to 10 THz, and
    wherein the capacitance C is higher than or equal to 10 nF.

7. The oscillation element according to claim 1, wherein the substrate is conductive.

8. An oscillator comprising:
the oscillation element according to claim 1; and
a power supply circuit including a power supply and a conductor electrically connects the power supply and the oscillation element.

9. The oscillator according to claim 8,
wherein the conductor that electrically connects the power supply and the oscillation element is an electric wire.

10. The oscillator according to claim 8, further comprising:
a shunt element,
wherein the shunt element is connected to the electric wire between the power supply and the oscillation element, and
wherein a length of the electric wire between the oscillation element and the shunt element is ¼ or shorter of a wavelength corresponding to a series resonant frequency $f_1$ of the oscillation element.

11. The oscillator according to claim 8,
wherein, when a negative resistance of the negative resistance element of the oscillation element is set as −Rd, a series resistance of the electric wire is set as $R_{S2}$, and an inductance of the electric wire is set as $L_2$, the power supply circuit satisfies a relationship of $R_d > R_{s2} > L_2 / CR_d$.

12. The oscillation element according to claim 1, further comprising a connecting portion for electrically connecting the first conductive layer and the second conductive layer to each other.

13. An oscillator comprising:
an oscillation element;
a power supply circuit including a power supply and a conductor electrically connecting the power supply and the oscillation element; and
a shunt element;
wherein the oscillation element includes a negative resistance element and a resonator including a first conductive layer, a second conductive layer, and a third conductive layer,
wherein the first conductive layer is electrically connected to the second conductive layer,
wherein the negative resistance element is electrically connected to the first conductive layer and the third conductive layer,
wherein the second conductive layer and the third conductive layer are arranged opposite each other and are also capacitively coupled to each other,
wherein the second conductive layer is arranged between the first conductive layer and the third conductive layer,
wherein the shunt element is connected to the electric wire between the power supply and the oscillation element, and
wherein a length of the electric wire between the oscillation element and the shunt element is ¼ or shorter of a wavelength corresponding to a series resonant frequency $f_1$ of the oscillation element.

14. An oscillator comprising:
an oscillation element;
a power supply circuit including a power supply and a conductor electrically connecting the power supply and the oscillation element; and
a shunt element;
wherein the oscillation element includes a negative resistance element and a resonator including a first conductive layer, a second conductive layer, and a third conductive layer,
wherein the first conductive layer is electrically connected to the second conductive layer,
wherein the negative resistance element is electrically connected to the first conductive layer and the third conductive layer,
wherein the second conductive layer and the third conductive layer are arranged opposite each other and are also capacitively coupled to each other,
wherein the second conductive layer is arranged between the first conductive layer and the third conductive layer,
wherein, when a negative resistance of the negative resistance element of the oscillation element is set as −Rd, a series resistance of the electric wire is set as $R_{S2}$, and an inductance of the electric wire is set as $L_2$, the power supply circuit satisfies a relationship of $R_d > R_{2s} > L_2 / CR_d$.

15. The oscillation element according to claim 1, wherein the oscillation element has an area where the first conductive layer, the second conductive layer and the third conductive layer are overlapped with each other in a planar view.

16. The oscillation element according to claim 1, wherein the oscillation element has an area where the first conductive layer and the second conductive layer are not overlapped with each other in a planar view.

17. The oscillation element according to claim 15, wherein the oscillation element has an area where the first conductive layer and the second conductive layer are not overlapped with each other in a planar view.

18. The oscillation element according to claim 1,
wherein, the second conductive layer has a first part that overlaps with the first conductive layer, and a second part that does not overlap with the first conductive layer, in planar view, and
an area of the first part is larger than an area of the second part in planar view.

19. The oscillation element according to claim 1, further comprising a connecting member that connects the first conductive layer and the second conductive layer,
wherein the second conductive layer has a portion that extends from the connecting member side towards the negative resistance element side and overlaps with the first conductive layer and the third conductive layer.

20. The oscillation element according to claim 1, further comprising a connecting member that connects the first conductive layer and the second conductive layer,
wherein the second conductive layer and the connecting member are connected in such a manner that the connecting member is connected to a part of the second conductive layer other than ends of the second conductive layer.

21. The oscillation element according to claim 1, wherein the second conductive layer has a first region, a second region located at a closer position to the negative resistance than the first region, and a connecting region arranged between the first region and the second region, and
the connecting region contacts with the first conductive layer.

* * * * *